United States Patent [19]
Hanrahan

[11] Patent Number: 5,945,217
[45] Date of Patent: Aug. 31, 1999

[54] THERMALLY CONDUCTIVE POLYTRAFLUOROETHYLENE ARTICLE

[75] Inventor: James R. Hanrahan, Newark, Del.

[73] Assignee: Gore Enterprise Holdings, Inc., Newark, Del.

[21] Appl. No.: 08/950,358

[22] Filed: Oct. 14, 1997

[51] Int. Cl.⁶ .................................................. B32B 9/00
[52] U.S. Cl. ..................... 428/389; 428/403; 428/406; 428/421; 428/422; 174/252; 361/700; 165/104.17
[58] Field of Search .................................. 524/432, 437, 524/428, 441, 439; 428/420, 421, 402, 403, 406, 407, 422, 420.21, 467; 174/252; 361/700; 165/104.17, 104.21, 104.23

[56] References Cited

U.S. PATENT DOCUMENTS

| | | | |
|---|---|---|---|
| 2,893,105 | 7/1959 | Lauterbach | 28/72.2 |
| 3,953,566 | 4/1976 | Gore | 264/288 |
| 4,291,775 | 9/1981 | Collins | 177/1 |
| 4,557,957 | 12/1985 | Manniso | 428/36 |
| 4,615,933 | 10/1986 | Traut | 428/252 |
| 4,720,400 | 1/1988 | Manniso | 427/243 |
| 4,756,958 | 7/1988 | Bryant et al. | 428/320.2 |
| 4,840,838 | 6/1989 | Wyss | 428/234 |
| 4,856,294 | 8/1989 | Scaringe et al. | 62/259.3 |
| 4,857,668 | 8/1989 | Buonanno | 174/35 |
| 4,859,383 | 8/1989 | Dillon | 264/42 |
| 4,888,234 | 12/1989 | Smith et al. | 428/234 |
| 4,891,407 | 1/1990 | Mitchell | 525/104 |
| 4,931,479 | 6/1990 | Morgan | 521/76 |
| 4,945,125 | 7/1990 | Dillon et al. | 527/427 |
| 4,962,136 | 10/1990 | Peters | 523/220 |
| 4,972,846 | 11/1990 | Owens | 128/784 |
| 5,028,739 | 7/1991 | Keyser et al. | 174/35 |
| 5,045,635 | 9/1991 | Kaplo et al. | 174/35 |
| 5,066,683 | 11/1991 | Dillon et al. | 521/54 |
| 5,071,609 | 12/1991 | Tu et al. | 264/119 |
| 5,105,056 | 4/1992 | Hoge, Jr. et al. | 174/35 |
| 5,130,024 | 7/1992 | Fujimoto et al. | 210/500 |
| 5,202,536 | 4/1993 | Buonanno | 174/35 |
| 5,209,967 | 5/1993 | Wright et al. | 428/283 |
| 5,286,568 | 2/1994 | Bacino et al. | 428/422 |
| 5,294,270 | 3/1994 | Fenical | 148/576 |
| 5,401,901 | 3/1995 | Gerry et al. | 174/35 |
| 5,429,869 | 7/1995 | McGregor et al. | 428/364 |
| 5,454,471 | 10/1995 | Norvell | 206/545 |
| 5,519,172 | 5/1996 | Spencer et al. | 174/110 |
| 5,545,473 | 8/1996 | Ameen et al. | 428/283 |
| 5,591,034 | 1/1997 | Ameen et al. | 439/91 |
| 5,736,216 | 4/1998 | Shibahara et al. | 428/99 |
| 5,738,936 | 4/1998 | Hanraham | 428/313.5 |
| 5,800,491 | 9/1998 | Kolen et al. | 607/108 |

FOREIGN PATENT DOCUMENTS

| | | |
|---|---|---|
| 1053932 | 8/1991 | China . |
| 0 302 596 | 2/1989 | European Pat. Off. . |
| 61-040328 | 2/1986 | Japan . |
| 61-174700 | 8/1986 | Japan . |
| 62-100539 | 2/1987 | Japan . |
| 4335044 | 11/1992 | Japan . |
| 1724739 | 11/1989 | U.S.S.R. . |
| 88/04982 | 7/1988 | WIPO . |
| 93/00390 | 1/1993 | WIPO . |
| 9300163 | 1/1993 | WIPO . |
| 9300390 | 1/1993 | WIPO . |
| 94/02257 | 2/1994 | WIPO . |
| 94/19400 | 9/1994 | WIPO . |

*Primary Examiner*—Kristine Kincaid
*Assistant Examiner*—Dhiru R Patel
*Attorney, Agent, or Firm*—Victor M. Genco, Jr.

[57] ABSTRACT

A thermally conductive composite article is provided having a PTFE material or a PTFE matrix material which has disposed therein thermally conductive particles, and a phase change material.

8 Claims, 4 Drawing Sheets

THERMALLY CONDUCTIVE POLYTRAFLUOROETHYLENE ARTICLE

FIELD OF THE INVENTION

The present invention generally relates to an improved, thermally conductive polytetrafluoroethylene article.

BACKGROUND OF THE INVENTION

Integrated circuit ("IC") chips are steadily becoming smaller and more powerful. When compared to previous integrated circuit chips, this trend produces integrated circuit chips which are significantly more dense and which perform many more functions in a given period of time. This results in an increase in the electric current used by these integrated circuit chips. Consequently, smaller and more powerful integrated circuit chips tend to generate significantly more heat than larger and less powerful IC chips. Accordingly, heat management in electronic products has become a chief concern in IC chip design.

Reliability of electronic circuits is dependent upon proper matches in the coefficients of thermal expansion of various electronic components. For example, as temperature rises, mismatches in the coefficients of thermal expansion cause stresses to develop between electronic components. Under these circumstances, any increase in operating temperature will have a negative effect on reliability. In an effort to control heat better, the use of various heat sinks is now a central focus in electronic equipment design. Examples of common heat sinks employed today include: IBM Thermal Conductive Modules (ITCM); Mitsubishi High Thermal Conduction Modules (HTCM); Hitachi SiC Heat Sinks; Fujitsu FACOM VP2000 Cooling Mechanisms; or metal plates of copper or aluminum, for example.

In order to mate IC chips to heat sinks successfully, an interface which is elastic or otherwise conformable is preferred so as to ease installation and to minimize the effect of expansion and contraction between electronic components. Air gaps formed from improper installation of a chip to a heat sink, or expansion and contraction cycles during operation, can greatly impede the flow of heat from an IC chip. Conformability becomes especially important when the tolerances on the heat sink and chip tilt (in the case of flip chips) become large.

To date, thermal greases have been known to be a preferred material for use as an interface between heat sinks and electronic devices. While thermal greases may operate with success in such applications, they are replete with shortcomings which detract from their usefulness. For example, thermal greases tend to be difficult to control and are prone to contaminating components of an electronic device. Care must be taken when using these materials to prevent unwanted contamination of solder joints, and in the case of electrically conductive thermoset resins, unwanted contamination of adjacent conductors. In practice, this usually results in a significant amount of wasted material. Additionally, clean up of such materials often requires the use of solvents.

In U.S. Pat. No. 5,187,283, a gasket-type material is disclosed comprising a thin-film surrounding a meltable metal core. In operation, the gasket is installed as an interface and its temperature is increased to melt the metal core, which allows it to conform to the component parts. Unfortunately, this construction is believed to be ineffective in avoiding air gaps that can form during normal thermal cycling of the device. Further, as is a common problem with solid gasket materials in general, it is believed that this device may experience limited compressibility, requiring either the application of excessive pressure to the mating surfaces, or the use of unacceptably thick sections of the gasket.

U.S. Pat. No. 5,060,114, teaches that conformability may be obtained by curing a metal or metal oxide filled silicone around the component to be cooled. Although this method may be successful, it is believed to be unduly complicated, costly, and time consuming for practical widespread use.

Most commercially available products produce a conductivity of about 0.7 W/M °C. (for greases) to about 1.4 W/M °C. (for epoxies). Even the most advanced (and expensive) materials, such as silver filled epoxies, only achieve a conductivity in the range of about 3 to 4 W/M °C. With regard to easily handled materials, such as self-adhesive materials, these materials can typically achieve a conductivity of only about 0.37 to about 1.5 W/M °C., respectively. Although these commercial materials can produce better conductivities at high mounting pressures, they deliver extremely poor conductivity at very low mounting pressures (e.g., pressures below 10 lbs/in$^2$).

The foregoing illustrates limitations which exist in known thermally conductive articles. Thus, it is apparent that it would be advantageous to provide an improved thermally conductive article directed to overcoming one or more of the limitations set forth above. Accordingly, a suitable alternative is provided including features more fully disclosed hereinafter.

SUMMARY OF THE INVENTION

The present invention relates to a thermally conductive composite article having a PTFE material or a PTFE matrix material which has disposed therein thermally conductive particles, and a phase change material. The thermally conductive composite article of the present invention can be extremely thermally conductive, even providing an improved thermal interface to that of a thermal grease.

Preferred thermally conductive particles include, but are not limited to the following: metals, such as aluminum (Al), copper (Cu), nickel (Ni), silver (Ag), or Zinc (Zn); metal beads; metal powders; metal fibers; metal coated fibers; metal flakes; metal coated metals; metal coated ceramics; metal coated glass bubbles; metal coated glass beads; metal coated flakes; metal coated spheres or other thermally conductive particles, which may also be electrically non-conductive, such as zinc oxide, aluminum oxide, boron nitride (BN), aluminum nitride (AlN), diamond powder, or silicone carbide (SiC), for example.

The phase change material may be any material that changes from a solid state to a liquid state, or from a liquid state to a solid state within a temperature range from about 10° C. to about 90° C. Typical solid phase change materials for use in accordance with the present invention include, but are not limited to: salt hydrates, crystalline or semi-crystalline polymers, naphthalene, paraffins, non-paraffin organics, primary alcohols, fatty acids, or fatty acid esters, for example.

It is a purpose of the present invention is to provide a thermally conductive composite article for use in a variety of applications.

It is also a purpose of the present invention to provide an improved thermally conductive composite article for use as a thermally conductive gasket or interface.

Yet another purpose of the present invention is to provide an improved thermally conductive composite article that performs as an improved thermal interface, as compared to commercially available thermal grease, at pressures as low as 10 lbs/in$^2$ (10 psi).

BRIEF DESCRIPTION OF THE DRAWINGS

The foregoing summary, as well as the following detailed description of a preferred embodiment of the present invention, will be better understood when read in conjunction with the appended drawings. For purposes of illustrating the invention, there is shown in the drawings an embodiment which is presently preferred. It should be understood, however, that the invention is not limited to the precise arrangement and instrumentality shown. In the drawings.

DETAILED DESCRIPTION OF THE INVENTION

Figure 1:
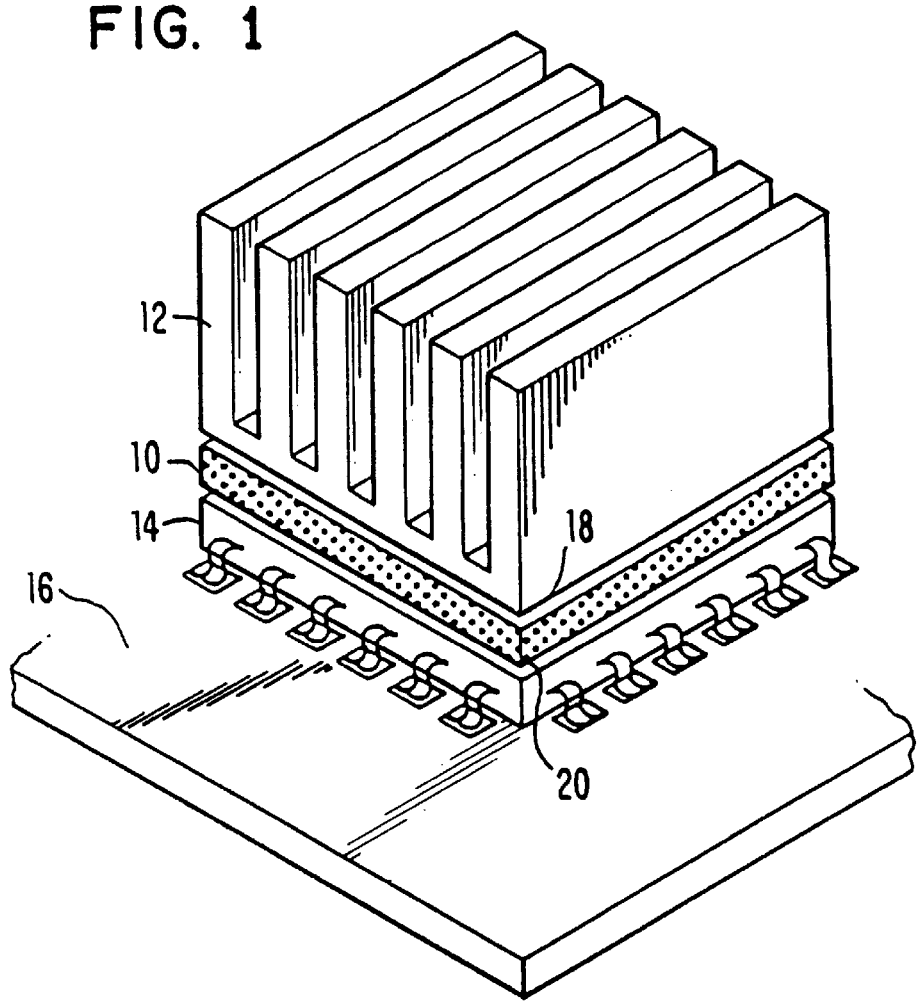
FIG. 1 is a three-quarter isometric view of one embodiment of a thermally conductive article of the present invention shown mounted between component parts of an electronic device.

Shown in FIG. 1 is a thermally conductive interface 10 in accordance with the teachings of one embodiment of the present invention. The thermally conductive interface 10 is mounted between two representative components, a heat sink 12 and an integrated circuit device 14, on an electronic circuit board 16. Unlike many presently available thermally conductive interfaces, an interface made in accordance with the present invention provides exceptional conformability between component parts. As a result, with minimal compressive pressure, the interface 10 forms a tight connection between the interface 10 and abutting surfaces 18, 20 of each of the components with little or no air spaces present to disrupt thermal conductivity. The interface 10 of the present invention can be formed in a variety of shapes and sizes to satisfy particular requirements.

As the term "tight" is used to describe the connection achieved between component parts using the interface of the present invention, it means a junction between component parts whereby the interface material has conformed to fill in irregularities in the surfaces of the component parts thereby significantly reducing or eliminating any air spaces therebetween. An interface made in accordance with the teachings of the present invention is particularly effective at establishing a tight connection at relatively low mounting pressures.

As the term "low mounting pressures" is used herein, it is intended to encompass the restricted pressures that sensitive electronic products (e.g., IC chips) can withstand without suffering damage, and includes pressures below about 30 lbs/in$^2$ (147 kg/m$^2$).

As the terms are used herein, the following terms shall have the meanings provided hereinbelow a phase change material capable of storing thermal energy as latent heat of a phase change of said phase change material:

A material in a "gaseous state" has neither a shape of its own nor a fixed volume. It takes the shape and volume of any container into which it is introduced.

A material in a "liquid state" has no specific shape; it assumes the shape of a portion of any container that it occupies. It does not expand to fill the entire container; it has a specific volume.

A material in a "solid state" has a firmness that is not associated with either gases or liquids. It has a fixed volume and shape. For purposes of this invention, gels or "semisolid" materials are considered solid materials.

Figure 2:
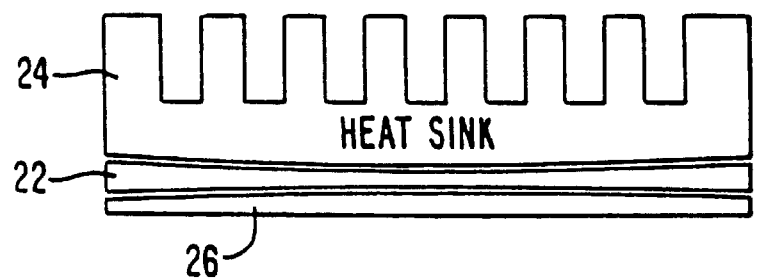
FIG. 2 is an elevational view of another embodiment of a thermally conductive article of the present invention shown mounted between two component parts of an electronic device.

Shown in FIG. 2 is an alternate embodiment of a thermally conductive interface 22 made in accordance with the teachings of the present invention. In such an embodiment, the interface 22 is deformed to provide a compliant connection between a heat sink 24 and an electronic component 26.

The thermally conductive interface 10 of the present invention is particularly designed for the dissipation of heat energy from component parts of electronic devices, such as power field effect transistors FETs, computer logic circuits, and other high density electronic circuits. It should be understood, however, that the interface of the present invention may be employed in a wide variety of other uses, such as, but not limited to: power transformers, transistor packages (such as those designated TO-3, TO-5, TO-18, TO-36, TO-66, TO-220, etc.) and diode packages (such as those designated DO-4, DO-5, etc.), for example.

It should be also understood that without departing from the teachings of the present invention, the thermally conductive properties of the present invention may also be employed in the transference of heat to certain component parts, such as heat sinks, cold plates, and the like.

In accordance with the teachings of the present invention, a thermally conductive composite article is made from a precursor material consisting of a PTFE or a PTFE matrix material and thermally conductive particles. A phase change material is disposed within the precursor material.

The precursor material is comprised of: thermally conductive particles and PTFE, in the form of paste, dispersion or powder. The precursor material is mixed in proportions of at least 20 to 99 weight percent thermally conductive particles and 1 to 80 weight percent PTFE, with proportions of 50 to 95 weight percent thermally conductive particles and 5 to 50 weight percent PTFE being preferred, and proportions of 70 to 95 weight percent thermally conductive particles and 5 to 30 weight percent PTFE being most preferred. Mixture of the precursor material may occur by any suitable means, including dry blending of powders, wet blending, co-coagulation of aqueous dispersions and slurry filler, or high shear mixing, for example.

As the term is used herein, "weight percent," shall mean a percentage calculated from the following method:

$$\frac{\text{total weight of an individual component}}{\text{total weight of all components}}$$
(i.e., total weight of thermally conductive particles or PTFE)

(i.e., total weight of thermally conductive particles and PTFE).

For example, a precursor material containing 80 grams of thermally conductive particles and 20 grams of PTFE would be comprised of 80 weight percent thermally conductive particles and 20 weight percent PTFE.

Thermally conductive particles suitable for use in producing the article of the present invention include, but are not limited to the following: metals, such as aluminum (Al), copper (Cu), nickel (Ni), silver (Ag), or Zinc (Zn); metal beads; metal powders; metal fibers; metal coated fibers; metal flakes; metal coated metals; metal coated ceramics; metal coated glass bubbles; metal coated glass beads; metal coated flakes; metal coated spheres; or other thermally conductive particles, which may also be electrically non-conductive, such as zinc oxide, aluminum oxide, boron nitride (BN), aluminum nitride (AlN), diamond powder, or silicone carbide (SiC), for example. Additionally, any combination of the foregoing may be employed. Many different types or combinations of the foregoing thermally conductive particles may be employed in the present invention.

As the term is used herein "particle" shall mean any flake, fiber, sphere or sphere like shape having an aspect ratio of 1:1 or greater, and having a size ranging from 10 nm to 500 $\mu$m. The average size of the thermally conductive particles may range from 10 nm to 500 $\mu$m, more preferably from 10 nm to 300 $\mu$m, and most preferably from 1 $\mu$m to 250 $\mu$m. Aspect ratios may range from 1:1 to 100:1, more preferably from 1:1 to 75:1, and most preferably from 1:1 to 50:1. Particle size was determined by using a LEADS & NORTHROP MICROTRAC particle size analyzer. The particle aspect ratio was determined by scanning electron microscopy.

When producing a thermally conductive, but electrically non-conductive composite article of the present invention, a preferred particle is boron nitride flake with an agglomerate size of about 200 $\mu$m and an average aspect ratio of about 2:1. When making a thermally and electrically conductive composite, a preferred particle is silver flake with a size of about 20 $\mu$m. In both type composite article, it may be also advantageous to add spherical-like particles to the flakes. For example, in an electrically non-conductive composite, aluminum oxide, having a particle size of about 40 $\mu$m, may be mixed with the boron nitride flakes to improve performance. In an electrically conductive composite, it may be advantageous to add silver coated aluminum particles, having an average particle size of about 40 $\mu$m.

The PTFE aqueous dispersion employed in producing the PTFE precursor material may be a milky-white aqueous suspension of PTFE particles. Typically, the PTFE aqueous dispersion will contain about 20% to about 70% by weight solids, the major portion of such solids being PTFE particles having a particle size in the range from about 0.05 $\mu$m to about 5.0 $\mu$m. Such PTFE aqueous dispersions are presently commercially available, such as from E. I. duPont de Nemours & Company, Inc., for example, under the tradename TEFLON® 3636, which is 18–24% by weight solids, being for the most part PTFE particles of about 0.05 $\mu$m to about 5.0 $\mu$m.

The phase change material (PCM) is added to the filled PTFE coagulum in the form of a lubricant. The phase change material in lubricant form is made by solvating the PCM with a solvent, or by melting the PCM and mixing with a solvent. The liquified PCM is then mixed with the precursor material and allowed to migrate uniformly throughout, thus achieving a uniform distribution of the PCM within the precursor material (See FIG. 3).

To achieve the thermally conductive composite article of the present invention, the phase change material may be added to the precursor material in a range from about 5 weight percent to about 50 weight percent; preferably from about 10 weight percent to about 40 weight percent, and most preferably 15 weight percent to about 25 weight percent.

In general, any phase change material can be used in the production of the thermally conductive composite article of the present invention. The phase change material may be selected from a wide variety of materials including, but not limited to: salt hydrates, such as $CaCl_2 6H_2O$; $Na_2SO_4 16H_2O$; naphthalene; crystalline paraffins, such as Pararan 4450 (made by Exxon Corporation) and SLACK WAX 3645 (made by Exxon Corporation); non paraffin organics, such as beeswax, oxazaline wax; crystalline polymers, such as polyvinylizlene chloride or polyethylene glycol (such as CARBOWAX® made by Union Carbide); high density polyethylene; solid polyhydric alcohols, such as neopentyl glycol ($C_5H_{12}O_4$); fatty acids or fatty acid esters, for example.

Preferred phase change materials are those materials that can be solvated to a high solids content (i.e., >25% by weight). More preferred are polymers that can be solvated to a high solids content (>25% by weight) with fluids that are typically used to process PTFE, such as mineral spirits, water, glycols, and alcohols. Most preferred are polymers that can be solvated with PTFE processing fluids and that can change physical state from a solid to a liquid at a temperature of less than 70° C.

In one embodiment of the present invention, polyethylene glycol (PEG) is employed, (obtained from Union Carbide under the tradename CARBOWAX®.) This material is an opaque waxy solid at room temperature which melts at about 25° C. Polyethylene glycol is available in a variety of molecular weights (approximately 200 to 8000) each with a different melting point. The PEG can be added in amounts ranging from 5 to 50 weight percent, preferably from about 10 to 40 weight percent, and most preferably from 15 to 25 weight percent.

Figure 3:
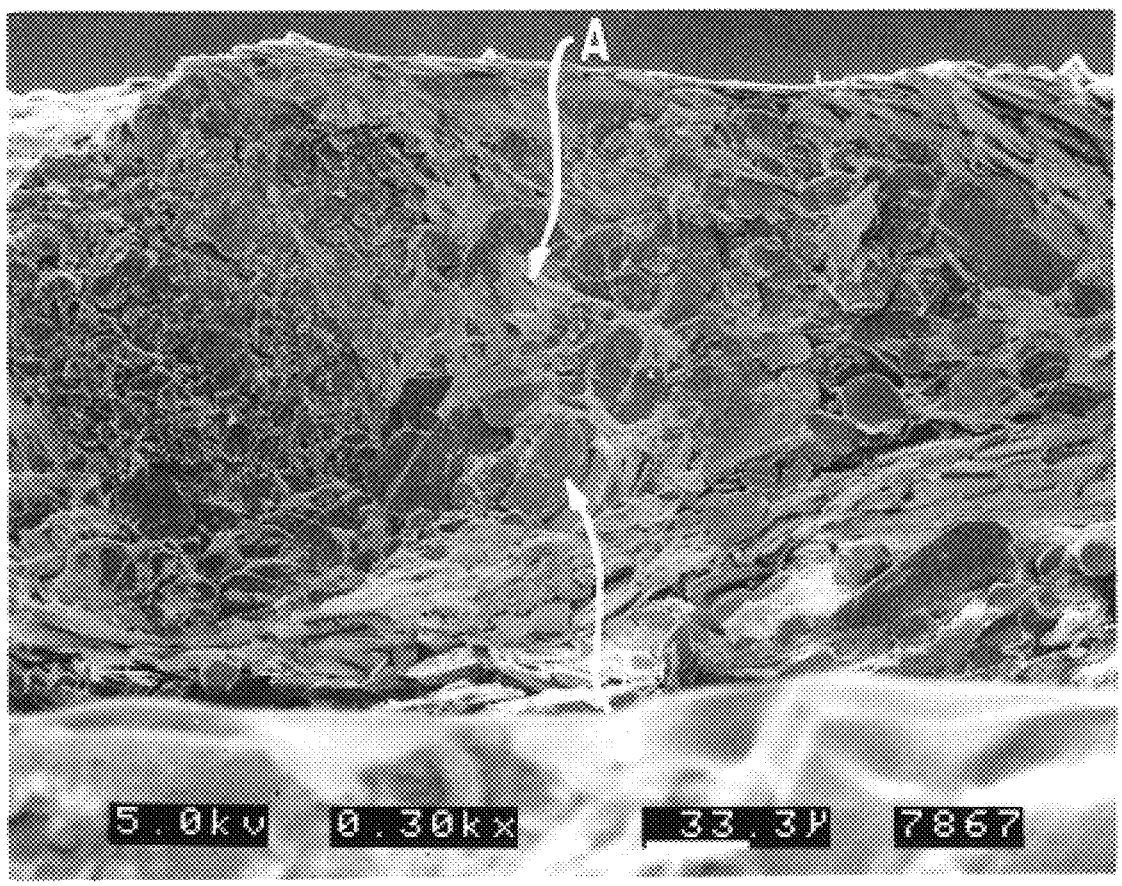
FIG. 3 is a cross-sectional scanning electron micrograph (SEM) of one embodiment of a thermally conductive polytetrafluoroethylene article of the present invention.

As best understood by reference to FIG. 3, a thermally conductive composite material of the present invention is illustrated which is substantially pore free, and which in one embodiment consists of a polymer matrix illustrated at A and thermally conductive particles illustrated at B. The polymer matrix of FIG. 3 consists of PTFE and polyethylene glycol. These components are indistinguishable in FIG. 3. The thermally conductive particles represented by B are boron nitride flake.

Figure 4:
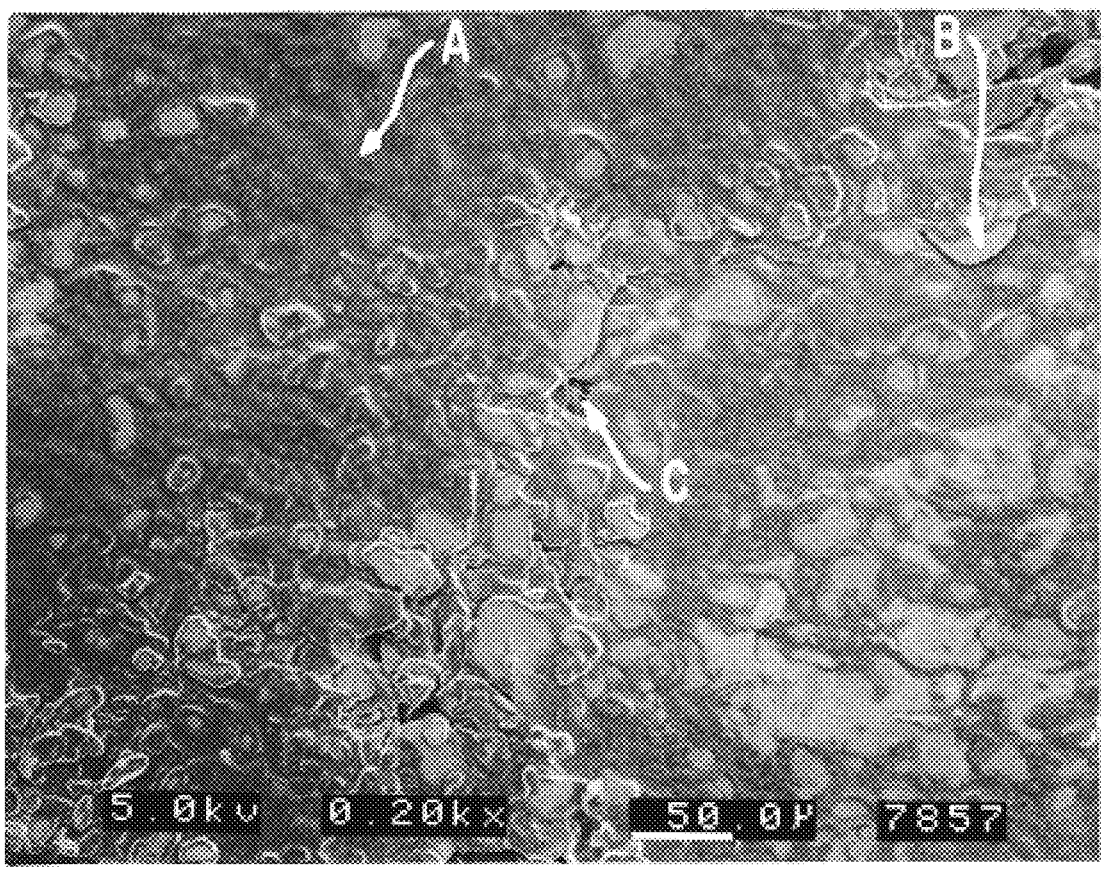
FIG. 4 is an SEM in top plan view of the article of FIG. 3.

As best seen from reference to FIG. 4, a plan view of the thermally conductive composite article of FIG. 3 is illustrated which consists of the polymer matrix A and the thermally conductive particles B. However, there is shown at location C a PTFE fibril which can be distinguished separately from the phase change material disposed within polymer matrix A.

Test for Measuring Thermal Conductivity

Figure 5:
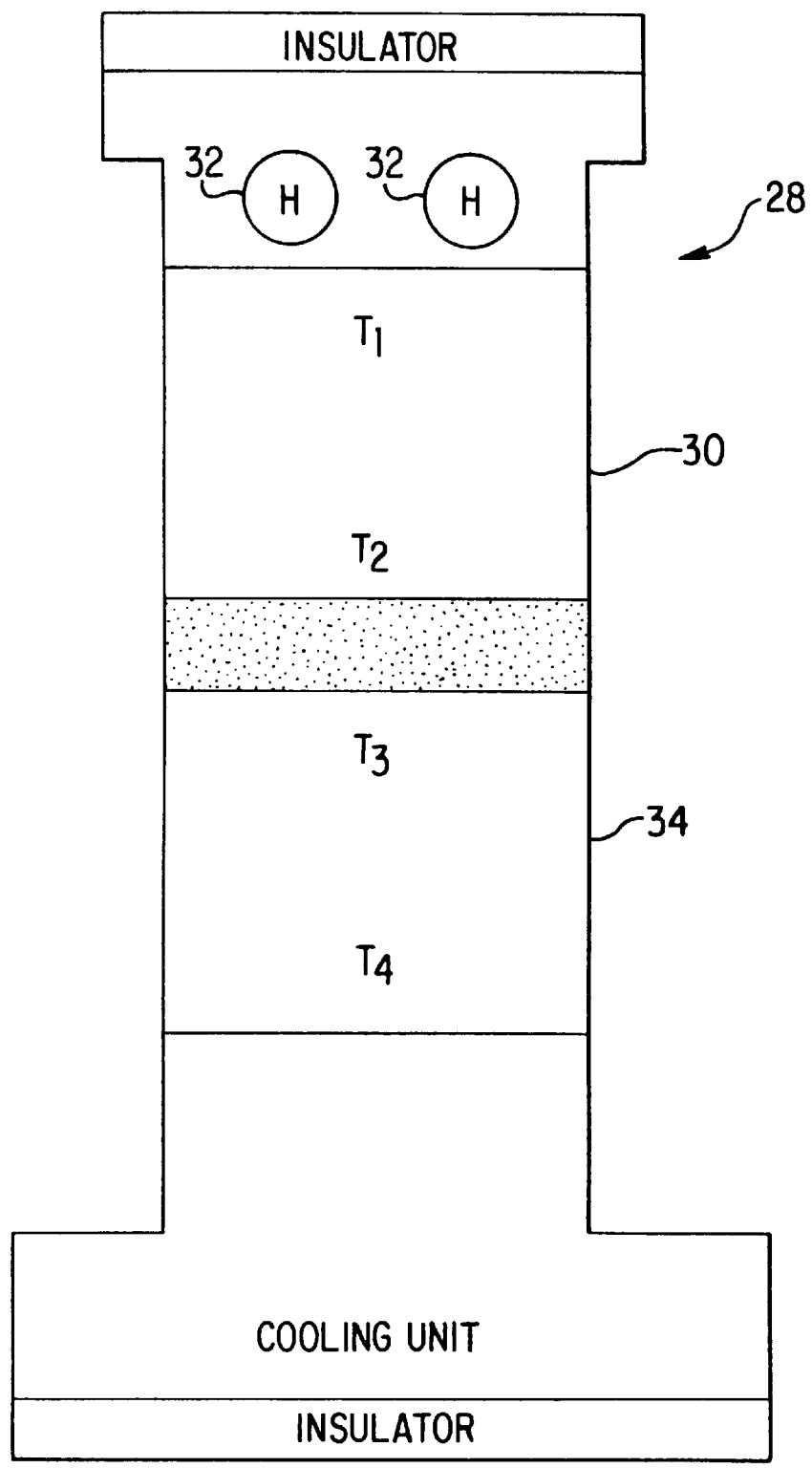
FIG. 5 is a diagrammatic view of an apparatus used for measuring thermal conductivity of an article.

An apparatus used for measuring thermal conductivity is diagrammatically illustrated generally at 28 in FIG. 5. This apparatus is similar to the device described in ASTM D 5470-95 Standard Test Methods for Thermal Transmission Properties of Thin Thermally Conductive Solid Electrical Insulation Materials, Method A. The thermally conductive measuring apparatus 28 is built from a copper alloy. The cross sectional area of the apparatus 28 is a square, two inches on a side. An upper meter block 30 contains a heat source. Two cartridge heaters 32 supply the test apparatus with 120 watts of power. The apparatus is cooled on a lower meter block 34 with a continuous flow of chilled water, approximately 18° C.

The upper meter block contains four RTD's (resistive temperature device), bored 0.5 inches into each side and located 0.0625 inches from the surface that is in contact with the specimen (location T2 in the figure). The temperature of the hot side of the specimen is approximated by the average of the four RTD readings at location T2.

The lower meter block 34 has the exact RTD placement therein at location T3 as the upper meter block at location T2. The temperature on the cold side of the specimen is approximated with the average of the four RTD readings at location T3. Another temperature is monitored 1.625 inches away from the surface of the lower meter block, position T4. This temperature, T4, and the average temperature T3 are used to estimate the power transmitted through the test specimen. The power is calculated by using Fourier's conduction equation.

$$Q = \frac{kA(T3 - T4)}{d}$$

where:

Q=heat transmitted through specimen, W;
k=conductivity of lower meter block, W/M °C.;
d=distance between point T3 and T4, m;
A=cross sectional area of lower meter block, $m^2$;
T3=temperature at position T3, °C.; and
T4=temperature at position T4; °C.

The apparatus 28 is housed within a frame that has a pneumatic piston attached to the top. The piston is used to apply a desired pressure from 1 psi to 150 psi during testing.

To perform a test, a sample is placed between the upper and lower meter blocks. Prior to placing the sample between the blocks, the specimen is measured using a Mitutoyo brand digital snap gauge or equivalent. The accuracy of the thickness measurement should be within 0.5 mils. Pressure is applied, the heaters are turned on, and the flow of water is started. Temperature drop across the specimen and lower block is monitored for a minimum of 30 minutes. A computer data acquisition system records temperatures during the test. At the conclusion of the test, a final thermal resistance is calculated using the equation below:

$$\Theta = \frac{T2 - T3}{Q}$$

where:

$\Theta$=thermal resistance, °C./W;
T2=average temperature at position T2, °C.;
T3=average temperature at position T3, °C.; and
Q=power transmitted through specimen, W.

Thermal conductivity is calculated by using Fourier's conduction equation solved for k.

$$k = \frac{Qt}{A(T2 - T3)}$$

Using thermal resistance:

$$k = t/A\Theta$$

where:

k=thermal conductivity of specimen, W/M °C.;
t=original thickness of specimen, m;
A=cross sectional area of specimen, $m^2$; and
$\Theta$=thermal resistance, °C./W.

Data is reported as a function of the applied load.

Without intending to limit the scope of the present invention, the following examples illustrate how the present invention may be made and used.

EXAMPLE 1

15.34 pounds of boron nitride (POLARTHERM PT-670, obtained from Advanced Ceramics, Inc.) was slurried in 55.0 liters of de-ionized water. The slurry was the coagulated with 17.43 pounds of PTFE dispersion at 22.0% solids (type TE3636 obtained from E. I. duPont & Nemours Company). The coagulum was dried at 165° C. for 24 hours. The resulting cakes were then frozen at −10° C. for a minimum of 16 hours, and subsequently hand screened through a ¼" mesh metal screen to form a powder.

2.0 pounds of the resulting powder was compounded with 0.75 pounds of a lubricant that consisted of 0.50 pounds of polyethylene glycol (PEG 600 obtained from Union Carbide) and 0.25 pounds of isopropyl alcohol (IPA). The material was cooled to about −10° C. for a minimum of 16 hours. The lubed coagulum was then screened through a ¼" mesh metal screen and allowed to dwell at room temperature for a minimum of 16 hours. The material was then preformed into a 2.5" diameter pellet and extruded into a 4" wide tape approximately 50 mil thick. The tape was then calandered to a thickness of 7.5 mils. A sample was taken and heated to 80° C. for one hour to remove the IPA. The sample was then tested for thermal performance:

Thickness before test: 7.0 mils
Test Pressure*: 10 psi
Thermal Resistance: 0.035° C./W
Thickness after test: 6.5 mils
Compression at 10 psi: 7.1%
Thermal conductivity at 6.5 mils: 1.80 W/M °C.

*Copper blocks were heated to 60° C. before test began.

EXAMPLE 2

535.3 grams of 80 wt % boron nitride (POLARTHERM PT-670, obtained from Advanced Ceramics, Inc.) filled PTFE fine powder was mixed with 317.5 grams of 87.8 wt % of aluminum oxide (Type AS-40, obtained from Showa Denko America, Inc.) filled PTFE fine powder and tumbled together. This material was then compounded with a 340.2 grams of a lubricant that consisted of 226.8 grams of polyethylene glycol (PEG 600 obtained from Union Carbide) and 113.4 grams of isopropyl alcohol. The material was cooled to −10° C. for a minimum of 16 hours and screened through a ¼" mesh metal screen. The material was allowed to dwell at room temperature for a minimum of 16 hours. A 2.5" diameter pellet was made, and extruded into a 4" wide tape, approximately 50 mils thick. The tape was then calandered to 7 mils and heated to 80° C. for one hour to remove the IPA. The sample was then tested for thermal performance:

Thickness before test: 7.0 mils
Test Pressure*: 10 psi
Thermal Resistance: 0.028° C./W
Thickness after test: 6.5 mils
Compression at 10 psi: 7.1%
Thermal conductivity at 6.5 mils: 2.28 W/M °C.

*Copper blocks heated to 60° C. before test began.

EXAMPLE 3

10.99 pounds of boron nitride (POLARTHERM PT-670, obtained from Advanced Ceramics, Inc.) and 6.56 pounds of aluminum oxide (Type AS-40, obtained from Showa Denko America, Inc.) was slurried in 55.0 liters of de-ionized water. The slurry was then coagulated with 6.39 pounds of PTFE dispersion at 25.5 percent solids (Type TE-3636, obtained from E. I. duPont de Nemours and Company). The coagulum was dried at 165° C. for approximately 18 hours. The resulting cakes were then frozen at −10° C. for a minimum of 16 hours, and subsequently hand screened through a ¼ inch mesh metal screen. 392.9 g of the resulting filled fine powder was then compounded with 85.2 g of a lubricant consisting of 56.2 g of SLACK WAX 100 and 29.0 g of mineral spirits. The resulting lubricated coagulum was then frozen at −10° C. for a minimum of 4 hours and screened through a ¼ inch mesh metal screen. The powder was then allowed to dwell at ambient room conditions for a minimum of 16 hours, then preformed with a 2.5 inch diameter pellet, and extruded into a tape, approximately 4 inches wide and 50 mils thick. The tape was then calandered to a thickness of 8 mils. A sample was heated to 150° C. for 30 minutes to remove the mineral spirits. The sample was then measured for thermal performance as previously described.

Thickness before test: 8.0 mils

Test Pressure*: 10 psi

Thermal Resistance: 0.055° C./W

Thickness after test: 8.0 mils

Compression at 10 psi: 0.0%

Thermal conductivity at 8.0 mils: 1.43 W/M °C.

*Copper blocks heated to 60° C. before test began.

EXAMPLE 4

17.26 pounds of boron nitride (POLARTHERM PT-670, obtained from Advanced Ceramics, Inc.) was slurried in 75.8 liters of de-ionized water. The slurry was then coagulated with 7.52 pounds of PTFE dispersion at 25.5% solids (type TE 3636 obtained from E. I. duPont & Nemours Company). The coagulum was then dried at 165° C. for 24 hours. The resulting cakes were then frozen at −10° C. for a minimum of 16 hours, and subsequently hand screened through a ¼" metal mesh screen to form a powder. 0.95 pounds of the resulting powder was then compounded with 0.35 pounds of a lubricant that consisted of 0.22 pounds of polyethylene glycol (PEG 600, obtained from Union Carbide) and 0.11 pounds of isopropyl alcohol (IPA). The material was then processed as in Example 1, and tested for thermal performance.

Thickness before test: 7.0 mils

Test Pressure: 10 psi

Thermal Resistance: 0.027° C./W

Thickness after test: 7.0 mils

Compression at 10 psi: 0%

Thermal conductivity at 7.0 mils: 2.52 W/M °C.

COMPARATIVE EXAMPLE 1

A commercially available thermally conductive grease (Dow Corning® 340 Heat sink compound) was tested on the fixture of FIG. 5. The test was performed as previously described. However, because the grease is a viscoelastic solid, the thickness of the material must be limited or controlled. To accomplish this, polyimide/silicone tape was used to limit the thickness to 3 mils. The tape was applied to the outside perimeter surface of the cold block. The tape line covered less than 0.0625" along each edge of the surface of the cold block. The test was run at 10 psi. The following was determined:

Thermal Resistance: 0.050° C./W

Thermal Conductivity: 0.48 W/M °C.

RESULTS SUMMARY

| Identification | Thickness (mils) | % Compression | Thermal Res. (° C./W) | Thermal Cond. (W/M° C.) |
|---|---|---|---|---|
| Example 1 | 6.5 | 7.1 | .035 | 1.80 |
| Example 2 | 6.5 | 7.1 | .028 | 2.28 |
| Example 3 | 8.0 | 0.0 | .055 | 1.43 |
| Example 4 | 7.0 | 0.0 | .027 | 2.52 |
| Comp. Ex. 1 | 3.0 | N/A | .050 | 0.48 |

The foregoing demonstrates that a thermally conductive polytetrafluoroethylene article may be provided that has a thermal conductivity greater than a commercially thermally conductive grease. As is well understood by one skilled in the art, important to interface design is the thermal resistance between a heat sink and a heat source. Thermal resistance is dependent not only on a material's thermal conductivity, but also on how well the material wets and conforms to a mating surface, thereby decreasing thermal contact resistance.

The teachings of the present invention provide a polymer composite sheet having a high thermal conductivity and an ability to limit contact resistance sufficiently to achieve a thermally conductive interface having a lower thermal resistance than a commercially available thermal grease. This is achieved by the addition of a phase change material to the main body of the polytetrafluoroethylene article. The thermally conductive article of the present invention also offers the advantage of being non-contaminating and is easily handled in roll form to facilitate use and installation thereof.

Although a few exemplary embodiments of the present invention have been described in detail above, those skilled in the art readily appreciate that many modifications are possible without materially departing from the novel teachings and advantages which are described herein. Accordingly, all such modifications are intended to be included within the scope of the present invention, as defined by the following claims.

Having described the invention, what is claimed is:

1. An article comprising:
   a polytetrafluoroethylene (PTFE) material;
   thermally conductive particles; and
   a phase change material capable of storing thermal energy as latent heat of a phase change of said phase change material.

2. An article comprising:
   a heat sink;
   a polytetrafluoroethylene PTFE material;
   thermally conductive particles; and
   a phase change material.

3. An article comprising:
   a heat sink;
   an electronic component;
   a polytetrafluoroethylene PTFE material;
   thermally conductive particles; and
   a phase change material;
   wherein the PTFE material is disposed between the heat sink and the electronic component.

4. An article comprising:
   a polytetrafluoroethylene PTFE matrix material;
   thermally conductive particles; and
   a phase change material;
   wherein the thermally conductive particles and the phase change material are disposed within the PTFE matrix material.

5. The article of claims 1, 2, 3, or 4, wherein the thermally conductive particles are selected from a group consisting of: metals; aluminum (Al); copper (Cu); nickel (Ni); silver (Ag); and Zinc (Zn); metal beads; metal powders; metal fibers; metal coated fibers; metal flakes; metal coated metals; metal coated ceramics; metal coated glass bubbles; metal coated glass beads; metal coated flakes; metal coated spheres; zinc oxide; aluminum oxide; boron nitride (BN); aluminum nitride (ALN); diamond powder; and silicon carbide (SiC).

6. The article of claims 1, 2, 3, or 4, wherein the phase change material is selected from a group consisting of: salt hydrates, naphthalene, crystalline paraffins, non-paraffin organics, beeswax, oxazaline wax, crystalline polymers, high density polyethylene, solid polyhydric alcohols, fatty acids, and fatty acid esters.

7. The article of claims 1, 2, 3, or 4, wherein the phase change material is a material which changes state from a solid to a liquid or from a liquid to a solid within a temperature range of about 10° C. to about 90° C.

8. An article comprising:
   a polytetrafluoroethylene PTFE material;
   thermally conductive particles; and
   a phase change material;
   wherein the thermally conductive particles and the phase change material are disposed within the PTFE material.

* * * * *